United States Patent [19]

Clodgo et al.

[11] Patent Number: 4,981,530

[45] Date of Patent: Jan. 1, 1991

[54] PLANARIZING LADDER-TYPE SILSESQUIOXANE POLYMER INSULATION LAYER

[75] Inventors: Donna J. Clodgo; Rosemary A. Previti-Kelly, both of Richmond; Ronald R. Uttecht, Essex Junction; Erick G. Walton, South Burlington, all of Vt.

[73] Assignee: International Business Machines Corporation, Armonk, N.Y.

[21] Appl. No.: 276,597

[22] Filed: Nov. 28, 1988

[51] Int. Cl.$^5$ .................... H01L 21/56; H01L 21/47
[52] U.S. Cl. .................... 148/33.3; 437/235; 437/243
[58] Field of Search .............. 437/235, 243; 148/33.3, 148/DIG. 81

[56] References Cited

U.S. PATENT DOCUMENTS

| | | | |
|---|---|---|---|
| 4,222,792 | 9/1980 | Lever et al. | 148/1.5 |
| 4,349,609 | 9/1982 | Takeda et al. | 428/429 |
| 4,430,153 | 2/1984 | Gleason et al. | 156/643 |
| 4,480,009 | 10/1984 | Berger | 428/447 |
| 4,510,283 | 9/1985 | Takeda | 524/356 |
| 4,529,752 | 7/1985 | Bluestein | 523/214 |
| 4,626,556 | 12/1986 | Nozue et al. | 522/99 |
| 4,670,299 | 6/1987 | Fukuyama | 427/96 |
| 4,702,990 | 10/1987 | Tanaka et al. | 430/197 |
| 4,723,978 | 2/1988 | Clodgo et al. | 65/31 |

FOREIGN PATENT DOCUMENTS 0317205  5/1989  European Pat. Off. .

OTHER PUBLICATIONS

Roberts, E. D., "The Preparation and Properties of a Polysiloxane Electron Resist", J. Electrochem. Soc.: Solid-State Science and Tech., vol. 120, No. 12, Dec. 1973, pp. 1716-1721.

Flitsch, F. et al. "Planar Quartz-Polysiloxane Composite Insulator", IBM Tech. Discl. Bull., vol. 27, No. 7B, Dec. 1984, pp. 4267-4268.

Clodgo, D. J. et al, "Polysiloxane Dielectric for Multi-Level Metal", IBM Tech. Discl. Bull., vol. 28, No. 12, May 1986, p. 5246.

Babich, E. D. et al, "Radiation-Curable Polysiloxanes", IBM Tech. Discl. Bull., vol. 30, No. 3, Aug. 1987, pp. 1041-1042.

*Primary Examiner*—Olik Chaudhuri
*Assistant Examiner*—Ourmazd Ojan
*Attorney, Agent, or Firm*—William D. Sabo

[57] ABSTRACT

An improved insulation layer is formed by first preparing a solution by reacting water with an aminoalkoxysilane monomer in a solvent, using a critical mole ratio of water/monomer. After a sufficient aging period, the solution is coated onto a suitable surface, e.g. the surface of a semiconductor device, and then cured, in an essentially oxygen-free atmosphere, to a ladder-type silsesquioxane polymer. The insulation layer demonstrates excellent planarizing characteristics, while also exhibiting enhanced crack-resistance.

14 Claims, No Drawings

PLANARIZING LADDER-TYPE SILSESQUIOXANE POLYMER INSULATION LAYER

This invention relates to an improved insulation layer, and, more particularly, to a method of forming an insulation layer of a ladder-type silsequioxane polymer derived from an aminoalkoxysilane, which demonstrates improved planarizing properties.

In the field of semiconductor processing, it is well known to use organic materials as insulation layers. In particular, polyimide resins have been widely used for this purpose. However, it has been found that the polyimide resins, which have been used, while suitable in many respects, tend to exhibit rather poor planarizing characteristics over topographic obstructions. Because of these and other problems, the use of other organic materials, such as organosilanes, has been investigated.

For example, in IBM Technical Disclosure Bulletin, Vol. 28, No. 12, p. 5246 (May 1986), a polysiloxane dielectric is formed on a polyimide layer by spin-applying and then heat treating a hydrolyzed organosilane monomer (e.g., an aqueous solution of 3-aminopropyltriethoxy silane).

Also, in U.S. Pat. No. 4,480,009, issued to Berger on Oct. 30, 1984, selected polysiloxane units are incorporated into polyimides for the purpose of forming protective coatings with improved adhesion properties.

See also U.S. Pat. No. 4,222,792, issued to Lever et al. on Aug. 15, 1982, where an organosilane (i.e., a polysiloxane) is used as a fill material in the formation of planar, deep isolation trenches.

However, it has been found that the polysiloxanes, while generally having planarizing characteristics which improve upon the polymides, have demonstrated stress-induced cracking and relatively poor adhesion.

Recently, another type of organosilane—namely, a silsesquioxane polymer—has been introduced into the art for use as an insulation layer. For example, in U.S. Pat. No. 4,349,609, issued to Takeda et al. on Sept. 14, 1982, cured coatings of non-amino-containing ladder-type silsesquioxane polymers, either alone or in admixture with silanol or titanol compounds, are employed as interlayer insulation layers between metal wiring layers.

There are a number of problems, however, with the approach in Takeda et al. For instance, such systems must be stored at low temperatures to retard aging, and they have a limited shelf-life despite such precautions, leading to increased costs and process control problems in use. Also, the addition of silanol starting materials into the system tends to degrade the dielectric properties of the resulting layer.

U.S. Pat. No. 4,626,556, issued to Nozue et al. on Dec. 2, 1986, also discloses the formation of a non-amino-containing silsesquioxane polymer layer. According to the process in this patent, water is reacted with a trihalogenosilane in the production of an organopolysilsesquioxane, which is used in a mixture with a compound which generates crosslinking-reaction-active species upon irradiation, in the formation of a patterned insulation layer.

In U.S. Pat. No. 4,723,978, issued to Clodgo et al. on Feb. 9, 1988, an organoglass insulation layer is produced by first forming a modified ladder-type silsesquioxane polymer from a silanol solution, and then treating it in an oxygen plasma.

For a variety of reasons, none of the foregoing techniques has proven to be entirely satisfactory.

It is against this background that the present invention introduces a method of forming an improved insulation layer. In accordance with the invention, a solution is first prepared by reacting water with an aminoalkoxysilane monomer in a solvent, by employing a critical mole ratio of water/monomer. After the solution is allowed to sufficiently age, it is coated on a suitable surface, such as a surface of a microelectronic device, e.g. a semiconductor; and the coated surface is then heated in an essentially oxygen-free atmosphere and under such conditions as to form a layer of cured ladder-type silsesquioxane polymer. In the practice of the invention, an insulation layer is produced, which can achieve a high degree of planarization with improved crack resistance, while demonstrating satisfactory dielectric and adhesion properties. For example, it has been found that the improved insulation layer can reduce topographic steps by more than 70 percent and, simultaneously, fill sub-micron gaps of high aspect ratio, without exhibiting crack-formation through six continuous thermal anneal steps to 350° C., while having a dielectric constant and dissipation factor generally equivalent to or less than those commonly exhibited by cured polyimides.

In forming the insulation layer according to the method of the invention, a solution of a low molecular weight oligomer is first prepared. This is accomplished by reacting water with an aminoalkoxysilane monomer in a solvent. Suitable aminoalkoxysilane monomers include aminotrialkoxysilanes represented by the formula:

wherein $R_1$ is a hydrogen atom; a saturated hydrocarbon residue or an amino-substituted, saturated hydrocarbon residue, preferably having 1 to 5 carbon atoms; or a phenyl group or an alkyl-substituted phenyl group or derivatives thereof, the alkyl group preferably having 1 to 5 carbon atoms; wherein $R_2$ is a saturated hydrocarbon residue, preferably having 2 to 6 carbon atoms; and wherein $R_3$ is a saturated hydrocarbon residue, preferably having 1 to 5 carbon atoms. Also, mixtures of such aminotrialkoxysilanes can be used or mixtures of one or more such aminotrialkoxysilanes with, for example, a trialkoxysilane represented by the formula:

wherein $R_3$ is as defined above, and wherein $R_4$ is a saturated hydrocarbon residue, an aromatic residue or a saturated hydrocarbon residue monovalently attached to an aromatic residue, so as to form the species, —$(CH_2)_nC_6H_5$, wherein n=1-6, the hydrocarbon residue preferably containing 2 to 6 carbon atoms.

Preferred aminoalkoxysilane monomers include aminotrialkoxysilanes represented by the above formula (A), wherein $R_1$ is a hydrogen atom or a saturated hydrocarbon residue or an amino-substituted, saturated hydrocarbon residue, having 2 or 3 carbon atoms; wherein $R_2$ is a saturated hydrocarbon residue having 3 to 6 carbon atoms; and wherein $R_3$ is a saturated hydrocarbon residue having 1 to 4 carbon atoms. Also preferred, are mixtures of such preferred aminotrialkoxysilanes.

A particularly preferred group of aminoalkoxysilane monomers includes the following aminotrialkoxysilanes: γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane.

Any suitable solvent which can dissolve the aminoalkoxysilane and is miscible with water can be employed. Typical solvents include, for example, alcohols, such as methanol, ethanol, propanol, isopropanol, butanol, isobutanol, isoamyl alcohol, and the like; ethers, such as the cellosolves, e.g. methyl cellosolve, diglyme, dioxane, butyl carbitol, diethyl ether, tetrahydrofuran, anisole, and the like; aromatic alcohols, such as phenol, and the like; polyhydric alcohols, such as ethylene glycol, tetramethylene glycol, glycerol, and the like; ketones, such as methyl ethyl ketone, methyl isobutyl ketone, diethyl ketone, and the like; etc., as will be apparent to those skilled in the art. Preferred solvents include methanol, ethanol and isopropanol.

In carrying out the reaction between water and the aminoalkoxysilane, a critical mole ratio of water/monomer in the range from about 1.3/1 to about 1.7/1 is employed. Preferably, a mole ratio of water/monomer in the range from about 1.4/1 to about 1.6/1, and, more preferably, from about 1.45/1 to about 1.55/1 is employed. In a particularly preferred embodiment of the invention, a mole ratio of water/monomer of about 1.5/1 is employed.

In accordance with the invention, it is desired to form an idealized or near-idealized ladder-type silsesquioxane polymer structure. It is a discovery of the invention that the idealized structure can be approached by critically controlling the amount of water reacted with the aminoalkoxysilane. In this regard, if less than a water/monomer mole ratio of about 1.3/1 is used, a polymer product of unacceptably low average molecular weight will result. In addition, the resultant polymer will be hydrolytically unstable and sensitive to moisture, and the insulation layer will exhibit degraded electrical properties and non-uniform thickness.

On the other hand, if too much water is utilized, such that the water/monomer mole ratio exceeds about 1.7/1, increased incidence of branched polymer formation will result. Secondary effects include a reduced average molecular weight of the polymer product, and a final cured film which will exhibit degraded electrical properties, lower thermal stability and greater stress.

In order to facilitate control of the amount of water added and the formation of reactive silanol species, it is preferred to first dissolve the aminoalkoxysilane monomer in a non-aqueous solvent, and then add the desired amount of water, so that the mole ratio of water/monomer is within the critical range as defined above. In general, the concentration of the solution can vary over a wide range, but preferably from about 2.0 to about 50 parts by volume of solvent per part by volume of the aminoalkoxysilane is utilized.

Next, the solution is allowed to age for a period of time which is sufficient to allow condensation reactions to stabilize and formation of ladder-type oligomers. In general, the length of the aging period can vary broadly, depending upon the aminoalkoxysilane and the solvent used, the solvent concentration, the amount of water added, temperature, etc. Typically, however, the aging period is at least about 8 hours, and preferably ranges from about 24 to about 72 hours. If the solution is not allowed to sufficiently age, the requisite condensation reactions will not proceed to the degree which is necessary for the eventual formation of the desired idealized ladder-type silsesquioxane polymer structure.

The aged solution is then coated onto a suitable surface, such as a surface of a microelectronic device, e.g. a semiconductor. The nature of the surface, which is coated, is not critical so long as the aged solution will adhere to it. Thus, the surface may be, for example, an organic insulation layer (e.g., polyimides) or an inorganic substrate, such as Si, $SiO_2$, $Si_3N_4$, $Al_2O_3$ or common metallurgies, such as Al, Cu, Ti, Cr, W or alloys, and so forth.

The aged solution is applied to the surface to be coated in a conventional fashion. Typically, it is spun onto the desired surface, at a spin speed within the range from about 2,000–5,000 rpm, depending upon the desired thickness of the coating, which generally ranges from about 1,000 to about 15,000 Å.

After application of the aged solution, the layer is heated to effect formation of a ladder-type silsesquioxane polymer. The actual curing conditions, i.e. temperature, pressure and time, may vary over wide ranges and are generally dependent on the aminoalkoxysilane which is used, the water/monomer ratio, the desired thickness of the cured layer being produced, and other factors, which should be apparent to those skilled in the art. In general, however, temperatures in excess of about 150° C. for a period of about 30 to about 120 minutes at atmospheric pressure are typical.

In a preferred embodiment for carrying out the process of the invention, the heat treatment is performed in a series of steps at atmospheric pressure. In this manner, the layer is exposed to a temperature of about 85°–110° C. to drive off the solvent, and then successively increased temperatures in excess of about 200° C. to form the final cured layer.

The heat treatment must, however, be performed in an essentially oxygen-free atmosphere. In general, the level of oxygen gas or other oxygen-containing materials should be less than about 10 ppm. Otherwise, the polymer will react with oxygen to form —SiOH groups, which will, in turn, catalyze water diffusion and further silanol formation throughout the polymer matrix. This is considered undesirable, in that the presence of silanol functionality in the polymer will cause degradation of dielectric properties, for example, increasing the dielectric constant and the dissipation factor.

In addition, it has been found that, unless the heat treatment step is carried out in an essentially oxygen-free atmosphere, polymer shrinkage will occur during cure, leading to an increase in intrinsic film stress, and less crack-resistance. Further, the resistance of the layer to attack by conventional developing solutions will be lowered, if substantial amounts of oxygen are present during the heat treatment step. This can become important if it is desired to subsequently pattern the layer, through application of a conventional resist, followed by exposure and development with, for example, an alkali developing solution.

The ladder-type silsesquioxane polymer produced in accordance with the invention has an O/Si ratio which approximates the ideal ratio of 1.5/1. In addition, the cured polymer product has a relatively high organic content (C+N), which is generally in excess of about 25%, more usually at least about 50%, and preferably at least about 70%.

As such, an improved insulation layer is achieved, which has a wide variety of uses, such as in semiconductor processing applications. The insulation layer demonstrates enhanced planarizing characteristics over conventionally used polyimides, without associated adhesion problems. In addition, it has been found to be thermally stable and crack-resistant, while providing desirable electrical properties.

Without being bound by theory, it is believed that general reactions which take place in carrying out the process of the invention can be outlined as shown below. In the general reactions, the aminoalkoxysilane is represented by the aminotrialkoxysilane, $R_1HN—R_2—Si(OR_3)_3$, and methanol is indicated as the solvent.

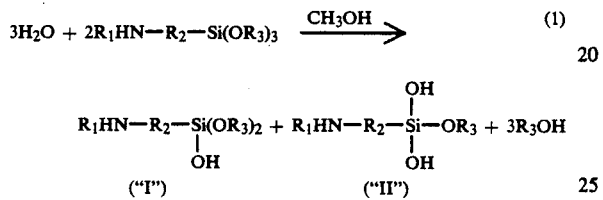
(1)

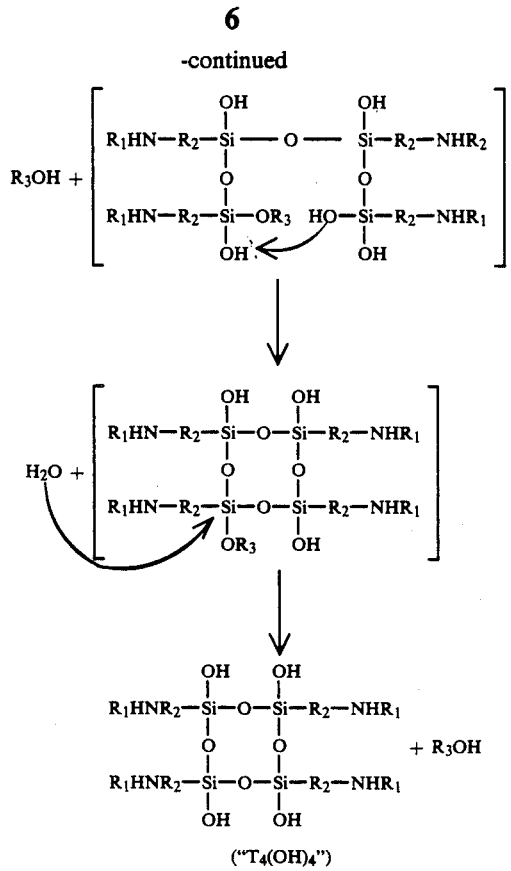

It should be noted that product "I" is much less reactive than is the diol, "II", in further condensation reactions. It is not expected, therefore, that condensation of product "I" would contribute to significant product formation.

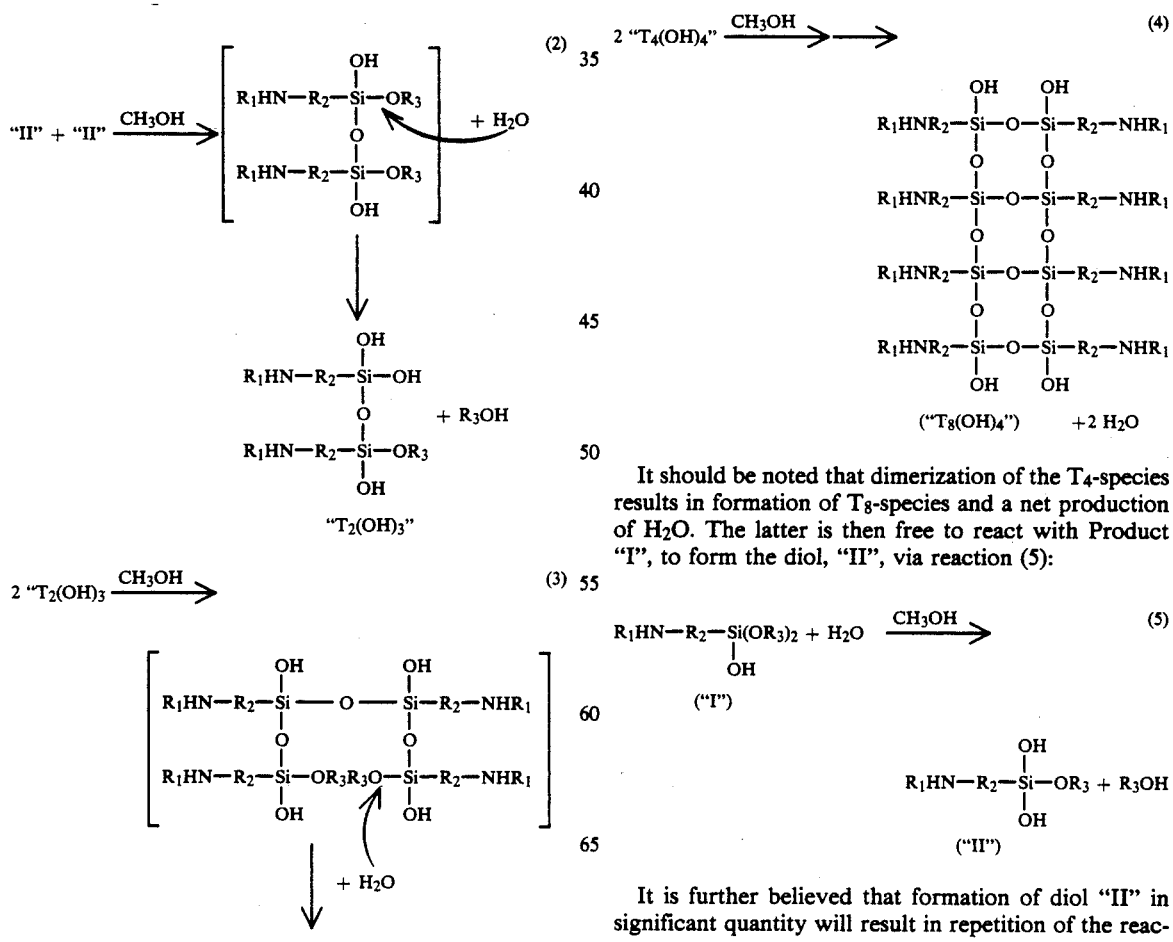

It should be noted that dimerization of the $T_4$-species results in formation of $T_8$-species and a net production of $H_2O$. The latter is then free to react with Product "I", to form the diol, "II", via reaction (5):

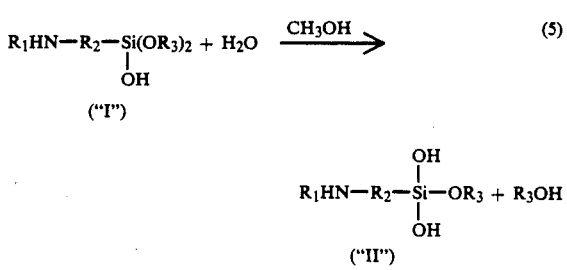

It is further believed that formation of diol "II" in significant quantity will result in repetition of the reaction sequence, (2) through (4). It may be seen that production of silane "ladder-polymer" species incorporating the eight-membered siloxane ring should be a primary result of the proposed set of silanol condensation reactions. Further condensation of $T_4$-and-$T_8$-silanol species should occur during the aging of the reaction mixture to higher-order oligomers or mixtures of such oligomers. It should be appreciated that the extent of oligomerization in solution during the aging period will depend on a number of factors, for example, the specific nature of the aminoalkoxysilane monomer and the solvent chosen, temperature, the mole ratio of water/monomer, the control of contaminants, and so forth.

It is also believed that even higher-order oligomer formation will occur after the aged solution is coated onto a suitable surface and excess solvent is removed. Polycondensation should proceed dramatically after coating of the solution and during subsequent thermal cures so as to result in the formation of a stable, well-ordered, ladder-type silsesquioxane polymer.

The following examples are provided to illustrate the invention. It should be noted that all operations specified in the examples were executed in a "Class 100" clean-room environment and in which the relative humidity was controlled to less than 50%.

EXAMPLE 1

A 172 ml aliquot of dry (<0.01% $H_2O$) methanol was transferred into a clean, dry Nalgene (polypropylene) bottle. A 43 ml aliquot of high purity[1] 3-aminopropyltriethoxysilane[2] was added to the methanol, and the solution was thoroughly mixed with the cap in place to control exposure to the atmosphere. A 5.00 ml aliquot of deionized, distilled $H_2O$ was then slowly added with swirling of the silane/methanol solution, the bottle was capped, and the mixture was shaken vigorously for 10–20 seconds. The closed container was allowed to sit undisturbed (i.e., to "age") in a dry (nitrogen purged) environment for about 48 hours at room temperature. The aged solution was filtered using a $0.2\mu$ polypropylene filter under conditions ensuring minimal atmospheric exposure.

[1]. Monomer content>99.5% (Gas Chromatography), and total ionics' concentration<5 ppm.
[2]. Commercially available from Union Carbide under the designation "A1100".

About 10 ml of the aged, filtered solution was added to the surface of a 10 cm (diameter) silicon substrate wafer by discharge through a point-of-use, $0.2\mu$ filter directly onto the substrate surface, effectively covering 80–100% of the substrate surface area.

The wafer was spin-accelerated on an MTI spin-apply tool (MTI Corp.) after a post-apply "dwell" period (quiescent state) of about 10 seconds. The acceleration was controlled to about 400 rpm/sec to a final spin-speed of about 3,000 rpm, where the final speed was maintained for about 25 sec.

The wafer was transferred to an MTI hot-plate (MTI Corp.), providing an approximate hot-plate exposure, and was baked in air at a temperature of about 105° C. for 12 min. to remove excess solvent. The wafer was then transferred to a quartz carrier and into a Corso-Gray furnace equipped with a quartz furnace tube and automated cantilever transfer mechanism designed to control the movement of the carrier into and out of the tube with a minimum of particulate contamination. A program was used to move the carrier through a series of temperature zones within the furnace (as summarized in the table below). Throughout the oven cure, a flow of dry nitrogen, filtered to eliminate particulates>$0.2\mu$ in diameter, was maintained to minimize substrate oxidation by controlling the oxygen content of the tube to <10 ppm in all zones where the temperature was >150° C. The ramp-sequence through the oven tube was as follows:

| ZONE | TEMP. (°C.) | TIME (min.) |
|---|---|---|
| 1 | 95 | 10 |
| 2 | 112 | 10 |
| 3 | 116 | 10 |
| 4 | 150 | 10 |
| 5 | 210 | 10 |
| 6 | 280 | 10 |
| 7 | 320 | 10 |
| 8 | 350 | 30 |

After the (combined) 100 min. oven-cure in $N_2$, the carrier was withdrawn to the first zone (95° C.) in flowing $N_2$, where the carrier and substrate were permitted to cool to less than 150° C., at which point the substrate was removed from the furnace.

The above-noted procedure produced a cured silsesquioxane film approximately 4800 Å thick as measured by ellipsometry and presented an infrared spectrum containing the characteristics of a silsesquioxane polymer having a significant, bulk "ladder-type" structure, as measured by FTIR. Using standard MOS-type substrate monitors, the dielectric properties of the film were measured. The dielectric breakdown was >6 MV/cm, the dielectric constant was about 3.4 (1 MHz), and the dissipation factor was 0.1 (1 MHz). The intrinsic film stress was tensile and <$10^8$ dynes/cm$^2$, as measured by a Tropel optical flatness testor.

EXAMPLE 2

A 162 ml aliquot of dry (<0.01% $H_2O$) methanol was transferred into a clean, dry Nalgene (polypropylene) bottle. A 40.6 ml aliquot of high purity[1] N-$\beta$-aminoethyl-$\gamma$-aminopropyltrimethoxysilane[2] was added to the methanol, and the solution was thoroughly mixed with the cap in place to control exposure to the atmosphere. A 5.00 ml aliquot of deionized, distilled $H_2O$ was then slowly added with swirling of the silane/methanol solution, the bottle was capped, and the mixture was shaken vigorously for 10–20 seconds. The closed container was allowed to sit undisturbed (i.e., to "age") in a dry (nitrogen purged) environment for about 48 hours at room temperature. The aged solution was filtered using a $0.2\mu$ polypropylene filter under conditions ensuring minimal atmospheric exposure.

[1]. Monomer content>99.5% (Gas Chromatorgraphy), and total ionics' concentration<5 ppm.
[2]. Commercially available from Dow Corning Corp. under the designation "Z6020".

About 10 ml of the aged, filtered solution was added to the surface of a 10 cm (diameter) silicon substrate wafer by discharge through a point-of-use, $0.2\mu$ filter directly onto the substrate surface, effectively covering 80–100% of the substrate surface area.

The wafer was spin-accelerated on a Convac apply-bake tool after a post-apply "dwell" period (quiescent state) of about 10 seconds. The acceleration was controlled to about 400 rpm/sec to a final spin-speed of about 3,000 rpm, where the final speed was maintained for about 25 sec.

The wafer was transferred to a bake track, providing an approximate hot-plate exposure, and was baked in air at a temperature of about 100° C. for 10 min. to remove excess solvent. The wafer was then transferred to a quartz carrier and into a Corso-Gray furnace equipped with a quartz furnace tube and automated cantilever transfer mechanism designed to control the movement of the carrier into and out of the tube with a minimum of particulate contamination. A program was used to move the carrier through a series of temperature zones within the furnace, as shown in the table for Example 1. Throughout the oven cure, a flow of dry nitrogen, filtered to eliminate particulates $>0.2\mu$ in diameter, was maintained to minimize substrate oxidation by controlling the oxygen content of the tube to $<10$ ppm in all zones where the temperature was $>150°$ C.

After the (combined) 100 min. oven-cure in $N_2$, the carrier was withdrawn to the first zone (95° C.) in flowing $N_2$, where the carrier and substrate were permitted to cool to less than 150° C., at which point the substrate was removed from the furnace.

The above-noted procedure produced a cured silsesquioxane film approximately 7800 Å thick as measured by ellipsometry and presented an infrared spectrum containing the characteristics of a silsesquioxane polymer having a significant, bulk "ladder-type" structure, as measured by FTIR. Using standard MOS-type substrate monitors, the dielectric properties of the film were measured The dielectric constant was about 3.4 (1 MHz) and the dissipation factor was 0.1 (1 MHz). The intrinsic film stress was tensile and $<10^8$ dynes/cm$^2$, as measured by a Tropel optical flatness testor.

What is claimed is:

1. A method of forming an insulation layer on a surface, comprising the steps of:
    reacting water with an aminoalkoxysilane monomer in a solvent to form a solution of a low molecular weight oligomer in said solvent, said reaction being carried out by employing a mole ratio of water/monomer in the range from about 1.3/1 to about 1.7/1;
    allowing said solution to age for a period of time which is sufficient to allow condensation reactions to stabilize;
    coating said surface with a layer of said aged solution; and
    heating said coated surface in an essentially oxygen-free atmosphere and under such conditions as to form a layer of cured ladder-type silsesquioxane polymer.

2. The method of claim 1, wherein said reaction is carried out by employing a mole ratio of water/monomer in the range from about 1.4/1 to about 1.6/1.

3. The method of claim 2, wherein said reaction is carried out by employing a mole ratio of water/monomer in the range from about 1.45/1 to about 1.55/1.

4. The method of claim 1, wherein said aminoalkoxysilane monomer is an aminotrialkoxysilane represented by the formula:

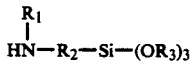

wherein:
    $R_1$ is a hydrogen atom; a saturated hydrocarbon residue or an amino-substituted, saturated hydrocarbon residue, having 1 to 5 carbon atoms; a phenyl group or an alkyl-substituted phenyl group or derivatives thereof, the alkyl group having 1 to 5 carbon atoms;
    $R_2$ is a saturated hydrocarbon residue having 2 to 6 carbon atoms; and
    $R_3$ is a saturated hydrocarbon residue having 1 to 5 carbon atoms;
    or a mixture thereof.

5. The method of claim 1, wherein said solvent is selected from the group consisting of methanol, ethanol and isopropanol.

6. The method of claim 1, wherein said aminoalkoxysilane monomer is first dissolved in a non-aqueous solvent to form a solution of said monomer in said solvent, and then water is added to said solution.

7. The method of claim 1, wherein said solution is allowed to age for a period of at least about 8 hours.

8. The method of claim 1, wherein said coated surface is heated in excess of about 150° C.

9. The method of claim 1, wherein said cured silsesquioxane polymer has an organic content of at least about 50 percent.

10. A method of forming an insulation layer on a surface of a semiconductor device, comprising the steps of:
    dissolving an aminotrialkoxysilane monomer in a non-aqueous solvent to form a solution of said monomer in said solvent, said aminotrialkoxysilane monomer being represented by the formula:

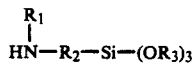

wherein:
    $R_1$ is a hydrogen atom or a saturated hydrocarbon residue or an amino-substituted, saturated hydrocarbon residue, having 2 or 3 carbon atoms;
    $R_2$ is a saturated hydrocarbon residue having 3 to 6 carbon atoms; and
    $R_3$ is a saturated hydrocarbon residue having 1 to 4 carbon atoms;
    or a mixture thereof;
    adding water to said solution in a mole ratio of water/monomer in the range from about 1.4/1 to about 1.6/1;
    allowing said solution to age for a period of time which is sufficient to allow condensation reactions to stabilize;
    coating said surface with a layer of said aged solution; and
    heating said coated surface in an essentially oxygen-free atmosphere and under such conditions as to form a layer of cured ladder-type silsesquioxane polymer having an organic content of at least about 50 percent.

11. The method of claim 10, wherein a mole ratio of water/monomer in the range from about 1.45/1 to about 1.55/1 is employed.

12. The method of claim 11, wherein said aminotrialkoxysilane monomer is selected from the group consisting of γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane.

13. The method of claim 12, wherein said solvent is selected from the group consisting of methanol, ethanol and propanol; said solution is allowed to age for a period ranging from about 24 to about 72 hours; and said coated substrate is heated in excess of about 150° C.

14. The method of claim 13, wherein said reaction is carried out by employing a mole ratio of water/monomer of about 1.5/1; and said cured silsesquioxane polymer has an organic content of at least about 70 percent.

* * * * *